United States Patent
Agarwal et al.

(10) Patent No.: US 11,271,011 B2
(45) Date of Patent: Mar. 8, 2022

(54) METHOD FOR HIGH PERFORMANCE STANDARD CELL DESIGN TECHNIQUES IN FINFET BASED LIBRARY USING LOCAL LAYOUT EFFECTS (LLE)

(71) Applicant: Samsung Electronics Co., Ltd., Suwon-si (KR)

(72) Inventors: Shyam Agarwal, Hwasung-si (KR); Abhishek Ghosh, Hwasung-si (KR); Parvinder Kumar Rana, Hwansung-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/924,377

(22) Filed: Jul. 9, 2020

(65) Prior Publication Data
US 2020/0343267 A1    Oct. 29, 2020

Related U.S. Application Data

(63) Continuation of application No. 16/124,946, filed on Sep. 7, 2018, now Pat. No. 10,748,932, which is a
(Continued)

(30) Foreign Application Priority Data

Sep. 22, 2016    (IN) .............................. 201641032424

(51) Int. Cl.
*H01L 27/118* (2006.01)
*H01L 21/8238* (2006.01)
(Continued)

(52) U.S. Cl.
CPC .................. *H01L 27/11807* (2013.01); *H01L 21/823821* (2013.01); *H01L 27/0207* (2013.01); *H01L 27/0924* (2013.01); *H01L 2027/11831* (2013.01)

(58) Field of Classification Search
CPC ................. H01L 27/11807; H01L 2027/11831
See application file for complete search history.

(56) References Cited

U.S. PATENT DOCUMENTS 7,224,029 B2    5/2007 Anderson et al.
10,748,932 B2 *  8/2020 Agarwal ............. H01L 27/0207
(Continued)

OTHER PUBLICATIONS

Sheikh, Farhana, et al., "The Impact of Device-Width Quantization on Digital Circuit Design Using FinFET Structures", EE 241 Spring 2004.
(Continued)

*Primary Examiner* — Zandra V Smith
*Assistant Examiner* — Andre C Stevenson
(74) *Attorney, Agent, or Firm* — Harness, Dickey & Pierce, P.L.C.

(57) ABSTRACT

Inventive concepts describe a method for high performance standard cell design techniques in FinFET based library using LLE. Inventive concepts describe a fabrication process using a standard FinFET cell layout having double diffusion breaks (DDBs) and single diffusion breaks (SDBs). According to one example embodiment, the method comprises of removing one or more fingers of a P-type FinFet (PFET) from a standard FinFET cell layout. After removing the one or more fingers, a Half-Double Diffusion Break (Half-DDB) is introduced on a N-type FinFET (NFET) side inside a cell boundary using a cut-poly layer. The cut-poly layer not only isolates the PFET and NFET gates and also becomes an integral part of hybrid structure. Further, the removed one or more fingers of PFET gates are converted to
(Continued)

two floating PFET gates by shorting a drain terminal and a source terminal of the PFET gate to a common power net.

16 Claims, 22 Drawing Sheets

Related U.S. Application Data continuation of application No. 15/613,712, filed on Jun. 5, 2017, now Pat. No. 10,103,172.

(51) Int. Cl.
*H01L 27/02* (2006.01)
*H01L 27/092* (2006.01)

(56) References Cited

U.S. PATENT DOCUMENTS

| | | |
|---|---|---|
| 2010/0183961 A1 | 7/2010 | Shieh et al. |
| 2016/0163716 A1 | 6/2016 | Zhang et al. |
| 2016/0211251 A1 | 7/2016 | Liaw |
| 2017/0141211 A1* | 5/2017 | Xie ................. H01L 29/785 |
| 2017/0287933 A1 | 10/2017 | Chen et al. |
| 2018/0006035 A1* | 1/2018 | Yuan ............. H01L 21/823814 |

OTHER PUBLICATIONS https://www.synopsys.com/COMPANY/PUBLICATIONS/SYNOPSYSINSIGHT/Pages/Art2-finfet-challenges-ip-lssQ3-12.aspx.

Joshi, et al. "Mechanical Stress Aware Optimization for Leakage Power Reduction," IEEE Transactions on Computer-aided Design of Integrated Circuits and Systems, vol. 29, No. 5, pp. 722-736 (2010).

Kahng, et al. "Exploiting STI Stress for Performance," IEEE, pp. 83-90 (2007).

Lee, et al. "Layout-induced stress effects on the performance and variation of FinFETs," SISPAD, pp. 369-372 (2015).

\* cited by examiner

METHOD FOR HIGH PERFORMANCE STANDARD CELL DESIGN TECHNIQUES IN FINFET BASED LIBRARY USING LOCAL LAYOUT EFFECTS (LLE)

CROSS-REFERENCE TO RELATED APPLICATION

This U.S. non-provisional patent application is a continuation of U.S. application Ser. No. 16/124,946, filed on Sep. 7, 2018, which is a continuation of U.S. application Ser. No. 15/613,712, filed on Jun. 5, 2017, now granted as U.S. Pat. No. 10,103,172 on Oct. 16, 2018, which claims priority under 35 U.S.C. § 119 to Indian Patent Application No. 201641032424, filed on Sep. 22, 2016, in the Indian Patent Office, the entire contents of each of the above-referenced applications are hereby incorporated by reference.

BACKGROUND

Inventive concepts generally relates to fabrication of semiconductor devices, and more particularly, to a method for high performance standard cell design techniques in Fin field effect transistor (FET) based library using local layout effects (LLE).

A system on a chip or system on chip (SoC or SOC) is an integrated circuit (IC) integrating all components of a computer or other electronic system into a single chip. The SoC may contain digital, analog, mixed-signal, and/or radio-frequency functions—on a single chip substrate. Layout of SoC typically comprises of billions of transistors, with around to 1 million standard logic cells, where a Standard logic cell occupies 50-60% area of a typical microprocessor.

Two types of transistor technologies may be used in SoC's, namely a planar transistors and fin field effect transistors (FinFET's). A characteristic of the FinFET is that the FinFET has a conducting channel covered by a thin silicon structure, called as fin or a gate electrode. The fin may run between a source terminal and a drain terminal, and may allow multiple gates to operate on a single transistor. Advantages of FinFET type of transistors over planar type transistors may include improved speed, reduced dynamic power, reduced standby power (Leakage), reduced process variability effects, short channel effects, and/or lesser area occupancy. Though FINFET may provide the aforementioned advantages, design of FINFET may be affected by various factors, including high gate capacitance which may result in increased delay and power, a quantized nature of Fins which may provide lesser design options and sub-optimal design options, and increased layout dependent effects (LLE) which may cause increased complexity.

Some of the factors to be considered while designing FinFET's include the discrete number of fins available for design. The constrained selection of device width may limit designers to choose appropriate sizes of N-MOSFET and P-MOSFET devices to achieve desired tradeoffs in performance, power, and/or robustness, making it much more difficult to achieve optimal and result-oriented β ratios (beta, which is the ratio of P and N widths) in FinFET's. Also, designers may not change the width of the transistor and may only add or subtract fins to change the drive current as fins come in discrete increments. Because of limited fin options available with FinFET, limited variants may be available. In many cases, these variants may not be sufficient to provide flexibility to the design of the SoC. Further, most of the standard cells designed are left skewed in terms of rise/fall especially, stacked designs with two or more inputs such as NAND, NOR, AO*, OA* gates. Balance for clock cells also may get affected because there is no fin combination for NFET and PFET available leading to equal delays.

Another factor for consideration includes high input capacitance of the FinFET. The parasitic/pin capacitances of FinFET are higher compared to planar transistors which results in relatively higher dynamic power numbers, as well as lesser speed FinFET's may bring a 66 percent increase in gate capacitance per micron, as compared to 28 nm process. This may correspond to the same level of the 130-nm planar node."

A typical physical implementation of a simple Boolean function of a FinFET based standard cell is illustrated in FIG. 1. The FinFET utilizes the desired available area and employ large device widths for PFETs and NFETs for achieving maximum performance. As shown in FIG. 1, the FinFET illustrates a layout of a typical simple Boolean function cell in a multi fin multi finger format, the total device width corresponds to the number of fins multiplied with the number of fingers. The different variants of the same logic function in the same cell area may be created by varying the number of fins of P or N device within the cell area limits constrained by the cell height and poly pitch. The cell height and poly pitch for a particular standard cell library architecture may be fixed or restrictive. As shown in FIG. 1, the FinFET structure includes twelve poly structures, which means twelve PFET devices 106 on top (e.g., in an NWELL), and twelve NFET devices 104 on bottom (e.g., in a PWELL). Both the PFET and NFET sides may be called active regions 108 of the FinFET structure, wherein the horizontal lines correspond to fins 102 and the vertical bars corresponds to polysilicon, or poly structures called as fingers 110. Layouts of different variants of the same function cell of FIG. 1 are shown in FIGS. 2 and 3 with reduced number of fins on the PFET and NFET side.

The standard cell layout may also include one or more diffusion (active (RX)) breaks due to layout design rules or circuit design constraints. Such diffusion breaks are of different types, and may include a Single Diffusion Break (SDB) and a Double Diffusion Break (DDB), the names referring to the number of gate polys impacted to create the diffusion break. The sample cell design with diffusion breaks are shown in FIGS. 4, 5 and 6. FIG. 4 illustrates an example formation of DDB 408 in a typical Boolean function cell layout implemented using two poly spacing. Similarly, FIGS. 5 and 6 illustrate example formation of SDBs and DDBs 1 in other variants of a typical physical design of standard cells. FIG. 5 illustrates an example formation of a double diffusion break (SDB) 508 inside the cell boundary, formed between the NFET and PFET fins 502 and formation of single diffusion breaks 512 on the cell boundaries 514. FIG. 6 illustrates example single diffusion breaks 612 created at cell boundary 614 only. There may be other variants as well where DDB may be at boundaries as well as inside the cell or only SDB at boundaries with one more SDB breaks inside the cell or any presentation using the combination of these 2 types of diffusion breaks. In the above layouts, in order to get more performance from of a given cell with maximum device widths possible, conventionally active number of fins or fingers should be increased for which the cell area correspondingly increases. Thus, cell size constraint is a problem to the designers.

Another concern is the discrete number of fins available for the design. Accordingly, the device widths are of quantized nature. This constrained selection of device width may limit designers to choose appropriate sizes of NFET or PFET devices to achieve desired tradeoffs in performance, power, and/or robustness making it more difficult to achieve desired and feature oriented β ratios (beta, which is the ratio of P and N widths) in FinFET's.

The FinFET cells designed through this conventional approach may be left skewed in terms of output rise/fall times, especially designs, for logic gates which employ stacked transistors with two or more inputs, such as simple NAND, NOR, AO*, OA* etc. Balance for clock cells also often suffers because equal fins for NFET and PFET does not necessarily translate to equal delays. Additional design options such as varying the channel length or body biasing, are more restrictive and/or are of limited benefit due to the intrinsic characteristics of FinFET technology. Local layout effects (LLE) are considered to be more complex in FinFET based technologies.

However, there are no existing arts on optimizing cell level performance itself exploiting the LLE effects for enhancing performance of the cell.

Thus, there is a desire for a system and method for high performance standard cell design techniques in FinFET based library using local layout effects (LLE).

SUMMARY OF INVENTIVE CONCEPTS

Various embodiments herein describe a method for high performance standard cell design techniques in finfet based cell library using local layout effects (LLE). According to one example embodiment, the method comprises of removing one or more fingers of a P-type FinFet (PFET) from a standard FinFET cell layout, introducing a Half-Double Diffusion Break (Half-DDB) on a N-type FinFET (NFET) side inside a cell boundary using a cut-poly layer to isolate the PFET and NFET gates, and converting the removed one or more fingers of PFET active gates to at least two floating PFET gates by shorting a drain terminal and a source terminal of the PFET gate to a common power net.

According to one example embodiment, a method of manufacturing a semiconductor device includes designing a poly reticle using a standard FinFET cell layout and removing one or more fingers of a standard cell of the poly reticle, converting the removed one or more fingers of the poly reticle by shorting a drain terminal and a source terminal to a common net, designing a cut-poly reticle with a half-double diffusion break isolate PFET gates and NFET gates in the standard cell, and using the poly reticle and the cut-poly reticle as photomasks to manufacture the semiconductor device.

According to one example embodiment, a method of manufacturing a semiconductor device includes designing a standard cell to be placed on a plurality of reticles and manufacturing the semiconductor device with the plurality of reticles. The designing the plurality of standard cells includes removing one or more fingers of an active gate of a first conductivity from the standard cell, introducing a Half-Double Diffusion Break on a side of a second conductivity, inside a cell boundary using a cut-poly layer to isolate gates of the first conductivity and gates of the second conductivity, and converting the removed one or more fingers of the active gate of the first conductivity gate to at least two floating gates of the first conductivity by shorting a drain terminal and a source terminal of the gate of the first conductivity to a common net The foregoing has outlined, in general, the various example embodiments of inventive concepts and is to serve as an aid to better understanding the more complete detailed description which is to follow. In reference to such, there is to be a clear understanding that inventive concepts is not limited to the method or application of use described and illustrated herein. It is intended that any other advantages and objects of inventive concepts that become apparent or obvious from the detailed description or illustrations contained herein are within the scope of inventive concepts.

BRIEF DESCRIPTION OF THE ACCOMPANYING DRAWINGS

The above and other objects, features and advantages of the inventive concept will be more apparent from the following detailed description of preferred embodiments made in conjunction with the accompanying drawings, in which.

Figure 1:
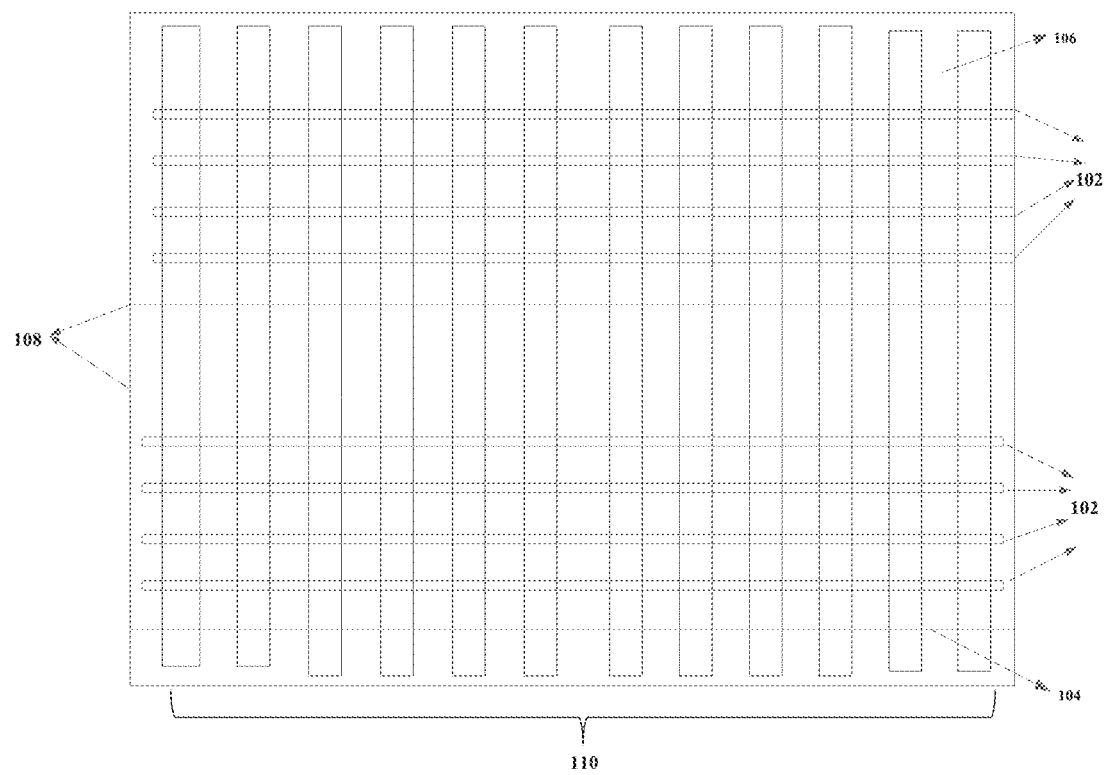
FIG. 1 illustrates a conventional layout of a simple Boolean function from a standard FinFET based cell library, according to the existing art.
Figure 2:
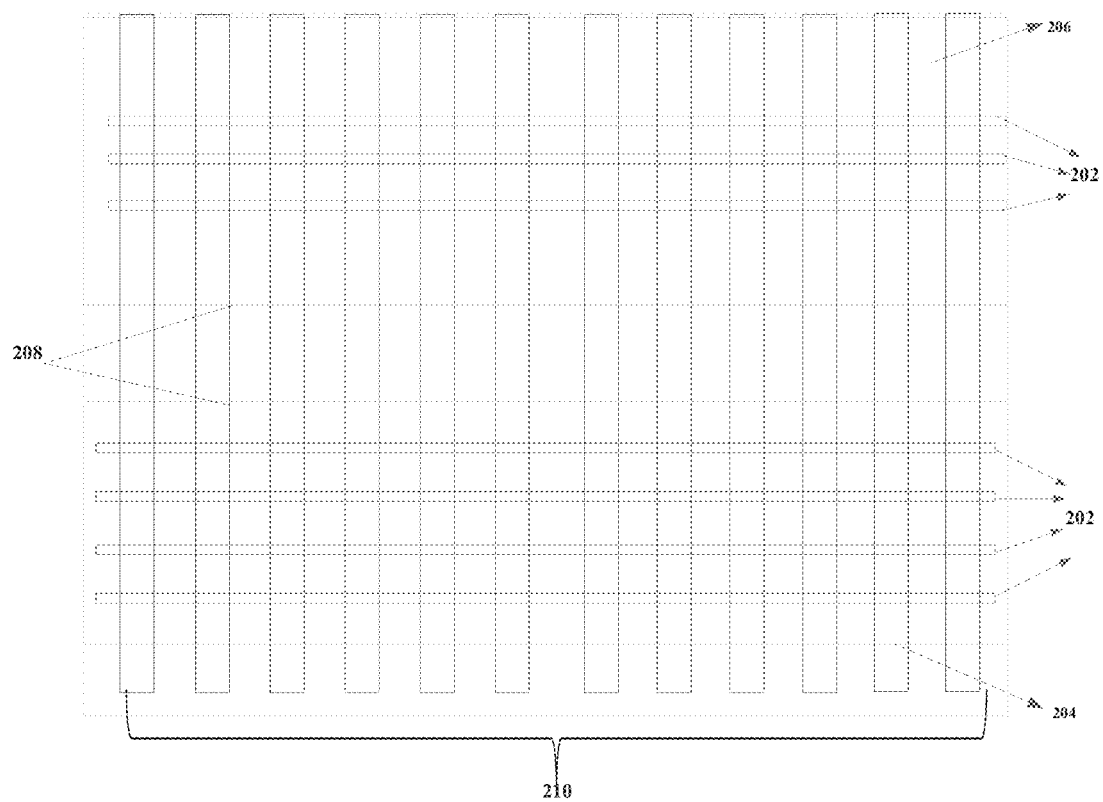
FIGS. 2 and 3 illustrate conventional layout of a simple Boolean function from Finfet based Standard Cell Library cell with reduced number of fins on PFET and NFET side, according to the existing art.
Figure 3:
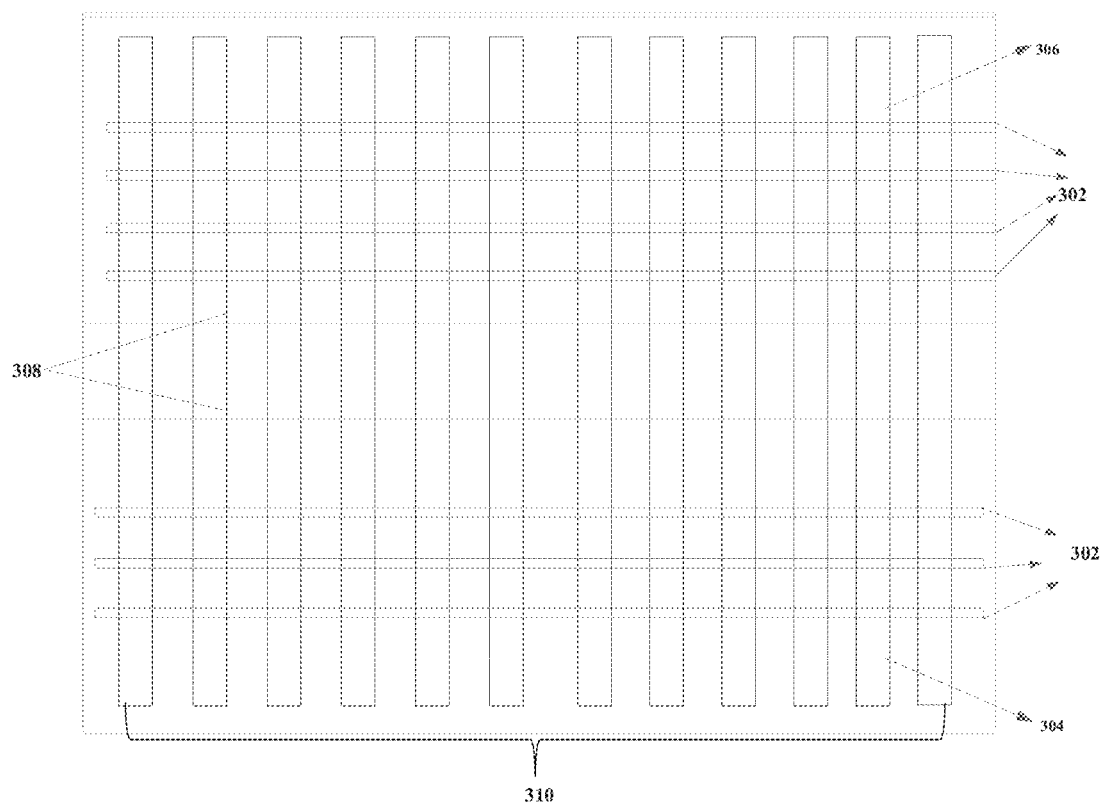

While the subject matter disclosed herein is susceptible to various modifications and alternative forms, specific embodiments thereof have been shown by way of example in the drawings and are herein described in detail. It should be understood, however, that the description herein of specific embodiments is not intended to limit inventive concepts to the particular forms disclosed, but on the contrary, the intention is to cover all modifications, equivalents, and alternatives falling within the spirit and scope of inventive concepts as defined by the appended claims.

DETAILED DESCRIPTION OF INVENTIVE CONCEPTS

Inventive concepts describe a method for high performance standard cell design techniques in finfet based library using local layout effects (LLE). In the following detailed description of the embodiments of inventive concepts, reference is made to the accompanying drawings that form a part hereof, and in which are shown by way of illustration specific embodiments in which inventive concepts may be practiced. These embodiments are described in sufficient detail to enable those skilled in the art to practice inventive concepts, and it is to be understood that other embodiments may be utilized and that changes may be made without departing from the scope of inventive concepts. The following detailed description is, therefore, not to be taken in a limiting concept.

Throughout the document, the terms "PFET side", "PFET gate" and "PFET cell" are interchangeably used. Similarly, the terms "NFET side", "NFET gate" and "NFET cell" are interchangeably used in the document.

Figure 7:
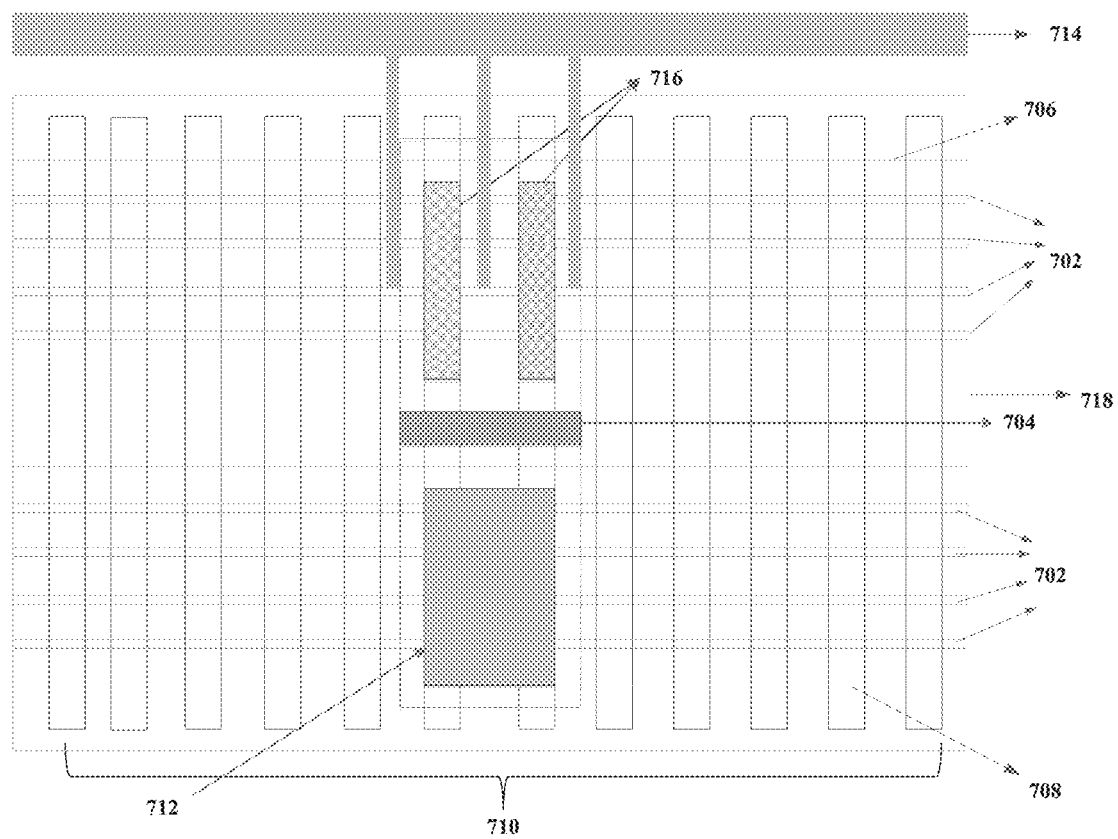
FIG. 7 is a schematic diagram illustrating an example method of fabricating a Fin Field Effect Transistor (FinFet) device, according to one example embodiment.

FIG. 7 is a schematic diagram illustrating an example method of fabricating a Fin Field Effect Transistor (FinFet) device, according to one example embodiment. According to this embodiment, the FinFET device includes a complementary metal-oxide-semiconductor (CMOS) device comprising a P-type metal-oxide-semiconductor (PMOS) FinFET device and an N-type metal-oxide-semiconductor (NMOS) FinFET device, wherein the PMOS FinFET device is called as PFET device and the NMOS FinFET device is called as NFET device. The following description includes a FinFET example to illustrate various embodiments of inventive concepts. It is understood, however, that the application should not be limited to a particular type of device, except as specifically claimed.

As shown in FIG. 7, upper portion of the FinFET device corresponds to a PFET side 706 and lower portion of the FinFET device corresponds to a NFET side 708. Both the PFET side 706 and the NFET side 708 comprise a plurality of fins 702 and fingers 710. In one example embodiment, the plurality of fingers may be called poly structures. In one example embodiment, in order to obtain more design options, the one or more fingers 710 on the PFET side 706 may be removed from a standard FinFET cell layout. The removed one or more fingers 710 may be converted into at least two floating PFET gates 716 by shorting a drain terminal and a source terminal of the PFET gate to a common power net 714. These floating PFET gates 716 may act as dummy and/or be considered as not active any more. Further, on the NFET side 708, a half-double diffusion break (half-DDB) 712 may be introduced inside a cell boundary 718 using a cut-poly layer 704. The cut-poly layer 704 then may isolate the PFET side 706 and the NFET side 708 and may form an integral part of new hybrid structure. Thus, the introduction of floating gates and half-DDB changes the layout of the semiconductor device. The new hybrid structure thus formed is illustrated in dotted lines in FIG. 7. In some example embodiments, because of the introduction of hybrid structure, the behavior and performance of different devices becomes dependent on surrounding structures. This effect is called a local layout effect (LLE). The newly introduced hybrid structure may improve the overall performance of the cell and reduces cell leakage too.

Figure 8:
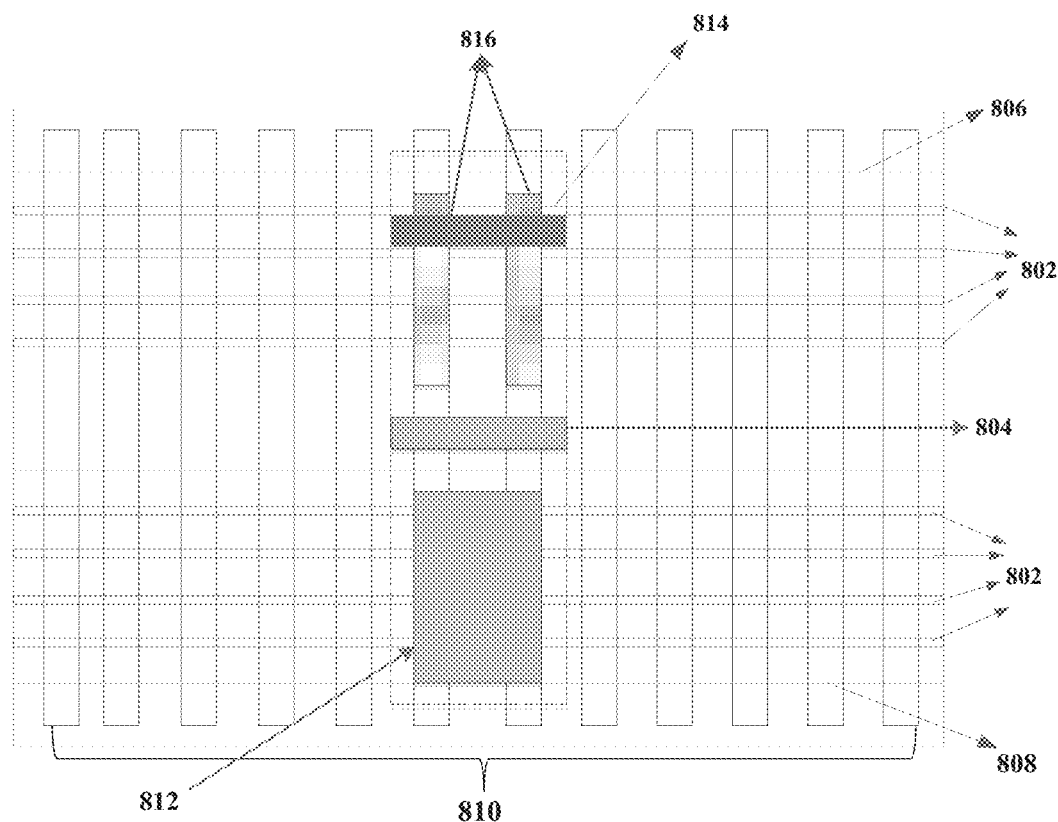
FIG. 8 is a schematic diagram illustrating an example method of fabricating a Fin Field Effect Transistor (FinFet) device, according to another embodiment.

FIG. 8 is a schematic diagram illustrating an example method of fabricating a Fin Field Effect Transistor (FinFet) device, according to another embodiment. In this embodiment, the method of fabrication remains same as that of FIG. 7, except the connection of a drain terminal and a source terminal of the PFET gate to a common internal net. As shown in FIG. 8, the upper portion of the FinFET device corresponds to a PFET side 806 and lower portion of the FinFET device corresponds to a NFET side 808. Both the PFET 806 and the NFET 808 comprise a plurality of fins 802 and fingers 810.

As shown in FIG. 8, one or more fingers from the PFET side 806 may be removed and then converted into at least two floating PFET gates 816 by shorting the drain terminal and the source terminal of the PFET gate to a common internal net 814. Further, at the NFET side 808, the half-DDB 812 is introduced inside the cell boundary using the cut-poly layer 804. The cut-poly layer 804 further isolates PFET and the NFET gates and become an integral part of the hybrid structure as shown in dotted lines in the FIG. 8.

Figure 9:
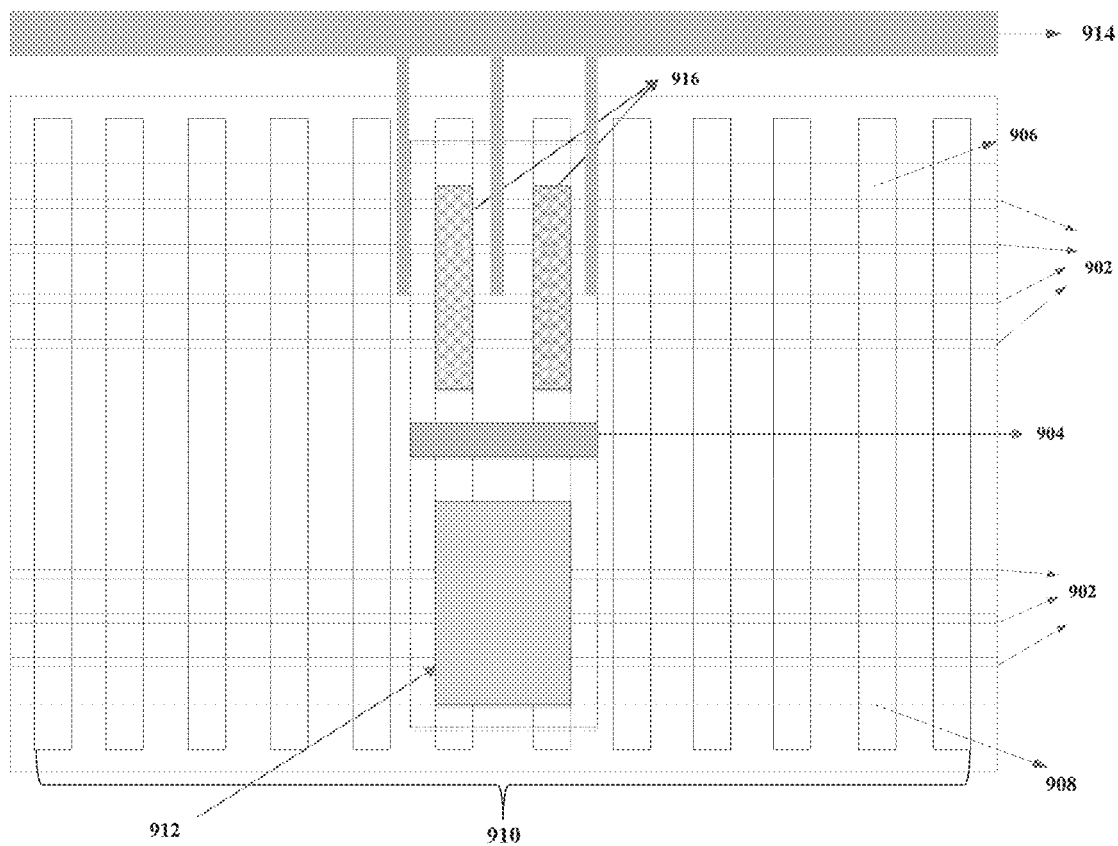
FIG. 9 is a schematic diagram illustrating an example method of fabricating a Fin Field Effect Transistor (FinFet) device, according to yet another embodiment.

FIG. 9 is a schematic diagram illustrating an example method of fabricating a Fin Field Effect Transistor (FinFet) device, according to another embodiment. In this embodiment, one or more fingers 910 from the PFET gate 906 are removed, wherein the removed one or more fingers 910 are converted from PFET active gates to at least two floating PFET gates by shorting the drain terminal and source terminal of the PFET gates to the common power net 914. The common power net 914 may include metal. Further, one or more fins 902 may be removed from the NFET side 908.

Figure 10:
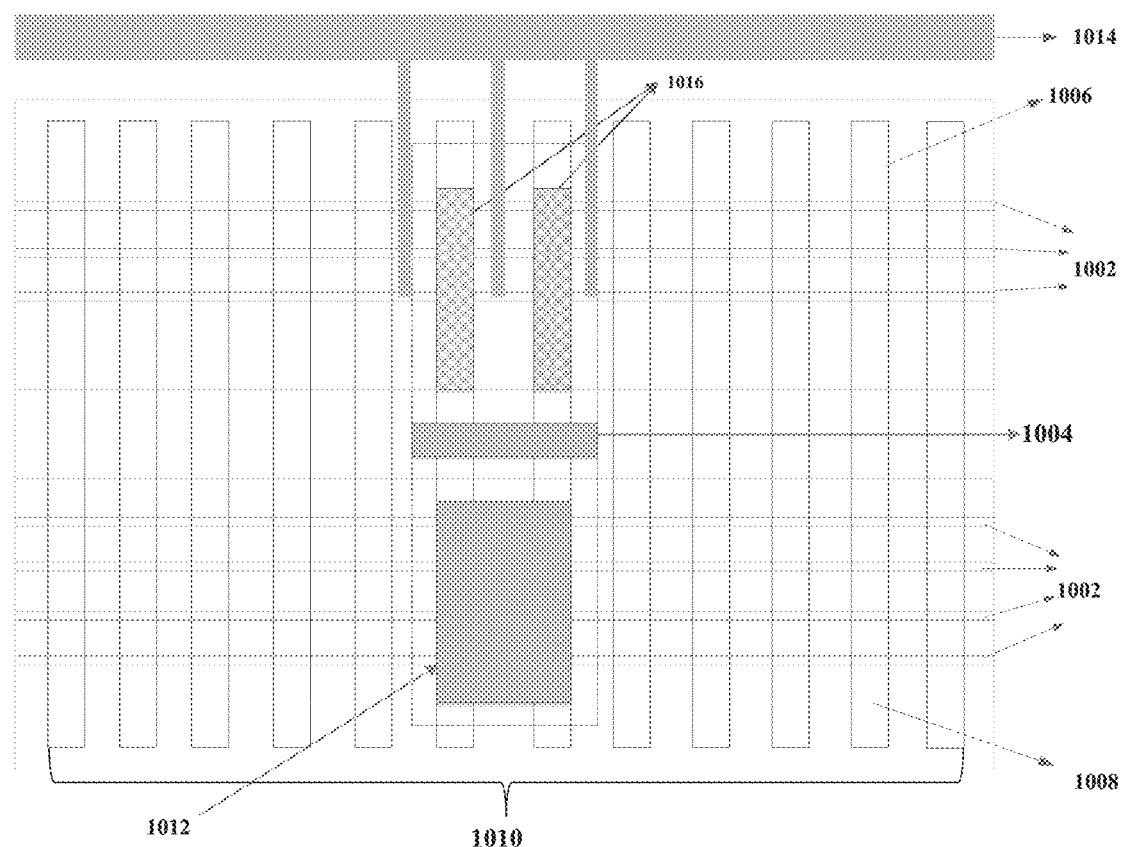
FIG. 10 is a schematic diagram illustrating an example method of fabricating a Fin Field Effect Transistor (FinFet) device, according to further embodiment.

FIG. 10 is a schematic diagram illustrating an example method of fabricating a Fin Field Effect Transistor (FinFet) device, according to another embodiment. In this embodiment, the fabrication method remains the same as that of the method mentioned in FIG. 9 with an additional step of removing of one or more fins from the PFET side 1006. As shown in FIG. 10, one or more PFET fins 1002 along with one or more PFET fingers 1010 are removed. The half-DDB 1012 is introduced on the NFET side 1008 inside the cell boundary using the cut-poly layer 1004. Later, the removed one or more PFET fingers of the PFET gate may be converted to at least two floating PFET gates 1016 by shorting the drain terminal and the source terminal of the PFET gate 1006 to the common power net 1014. The common power net 1014 may include metal. In one example embodiment, the at least two floating PFET gates may be created by shorting the drain terminal and source terminal of the PFET gates to the common internal net.

Figure 11:
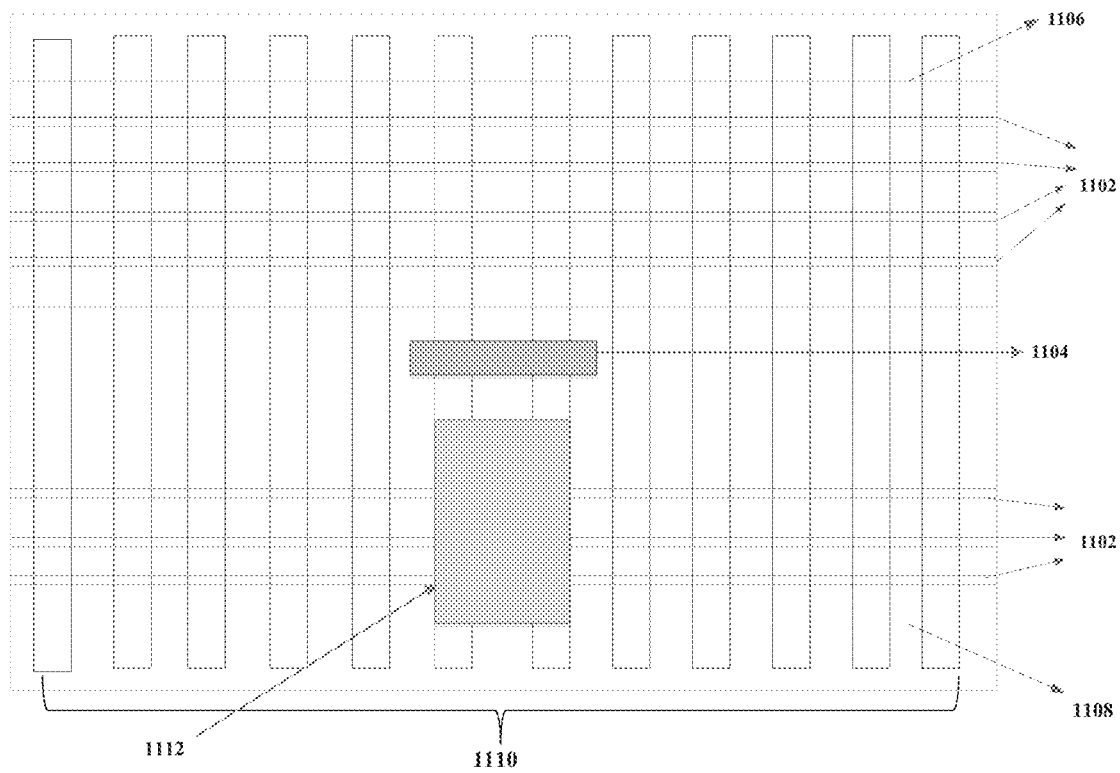
FIG. 11 is a schematic diagram illustrating an example method of fabricating a Fin Field Effect Transistor (FinFet) device, according to one example embodiment.

FIG. 11 is a schematic diagram illustrating an example method of fabricating a Fin Field Effect Transistor (FinFet) device, according to one example embodiment. In this fabrication method, one or more fins 1102 from the NFET side 1108 may be removed. The half-DDB layer 1112 may be inserted on the NFET side 1108 inside the cell boundary using the cut-poly layer 1104 while retaining the PFET gates 1106 in active state. Further, by removing one or more fins from the NFET cell may help in reducing leakage and input capacitance offered by the FinFET cell.

Figure 12:
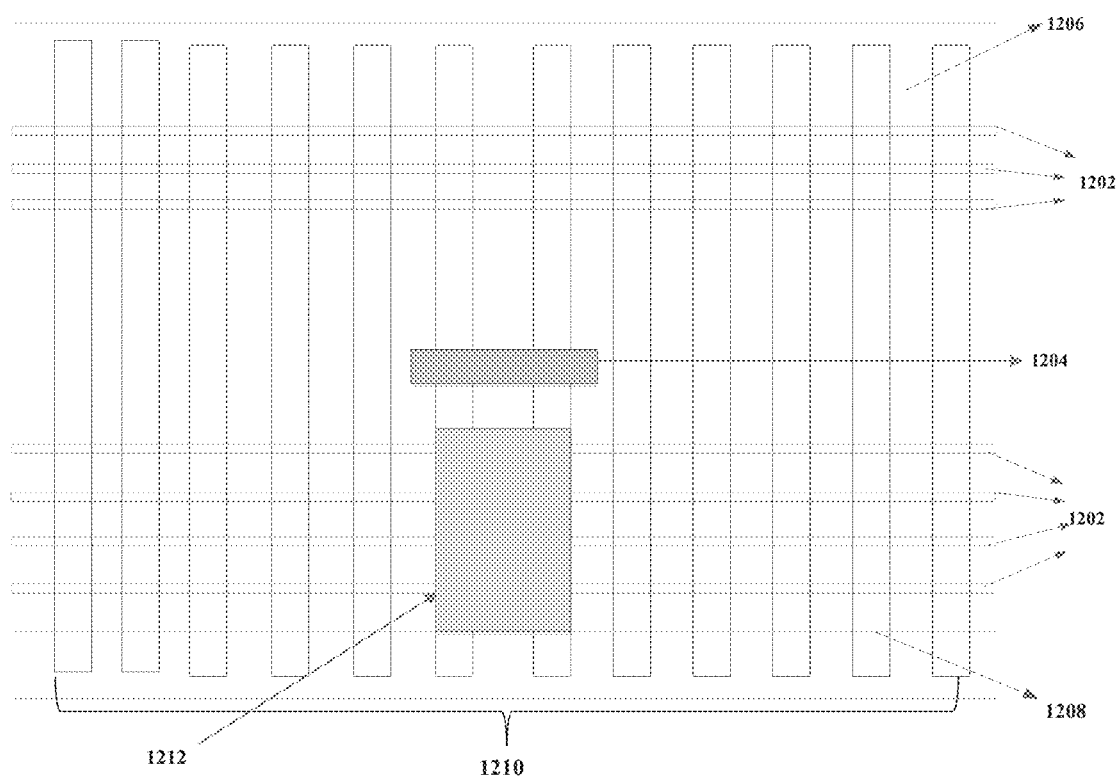
FIG. 12 is a schematic diagram illustrating an example method of fabricating a Fin Field Effect Transistor (FinFET) device, according to another embodiment.

FIG. 12 is a schematic diagram illustrating an example method of fabricating a Fin Field Effect Transistor (FinFET) device, according to another embodiment. In this embodiment, one or more fins 1202 on the PFET side 1206 are removed. However, the one or more fingers on the PFET side 1206 may remain in an active state. On the NFET side 1208, the half-DDB 1212 may be inserted inside the cell boundary using the cut-poly layer 1204 to isolate the PFET 1206 and NFET 1208 gates.

Figure 13:
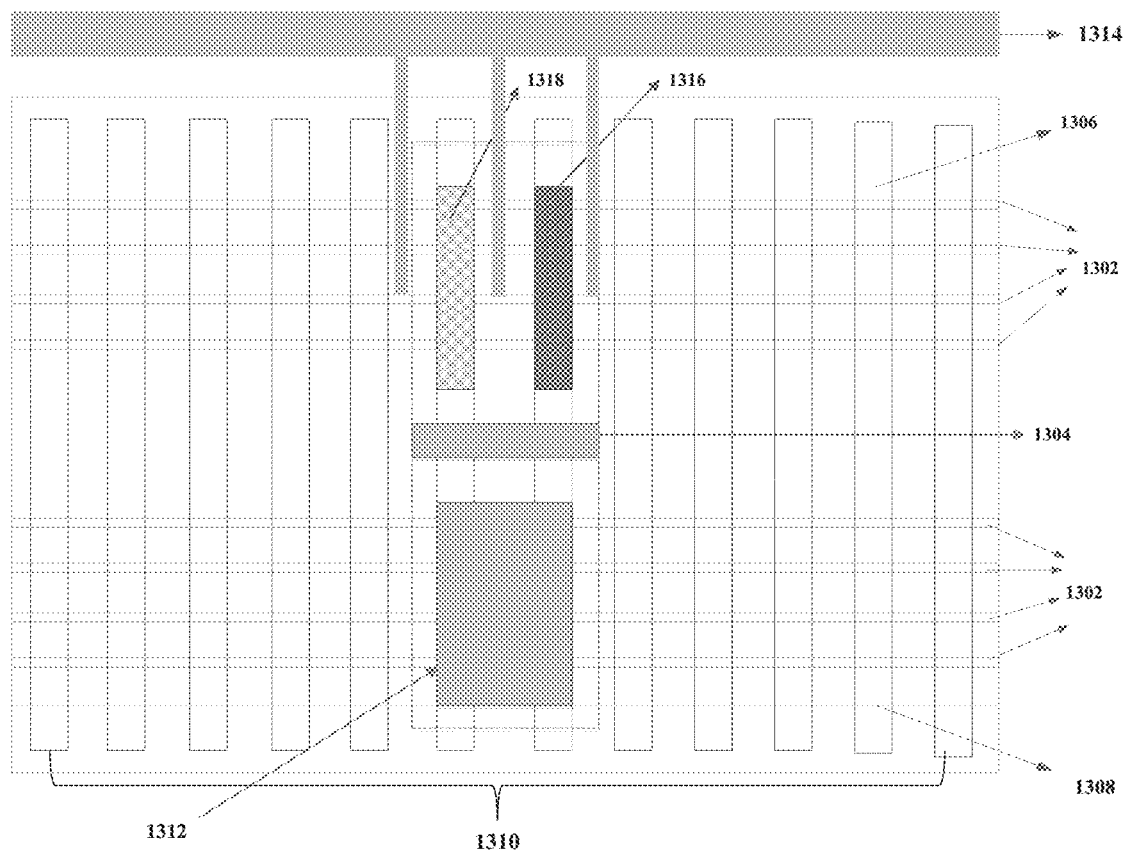
FIG. 13 is a schematic diagram illustrating an example method of fabricating a Fin Field Effect Transistor (FinFET) device, according to another embodiment.

FIG. 13 is a schematic diagram illustrating an example method of fabricating a Fin Field Effect Transistor (FinFET) device, according to another embodiment. According to this fabrication method, one or more fingers 1310 of the PFET side 1306 from the standard FinFET cell layout may be removed. The half-DDB 1312 is inserted on the NFET side 1308 inside the cell boundary using the cut-poly layer 1304 to isolate PFET 1306 and NFET 1308 gates. In addition, at least one PFET gate of at least two removed PFET gates 1306 cut from the NFET gate 1308 may be converted to a floating gate 1318 by shorting the drain and source terminal of the floating gate 1318 to the common power net 1314. The common power net 1314 may include metal. The other at least one PFET gate of the at least two PFET gates may be converted to an inactive gate using a single diffusion break (SDB) 1316 on the PFET gate 1306 cut from the NFET gate 1308. The resultant design is shown in FIG. 13.

Figure 14:
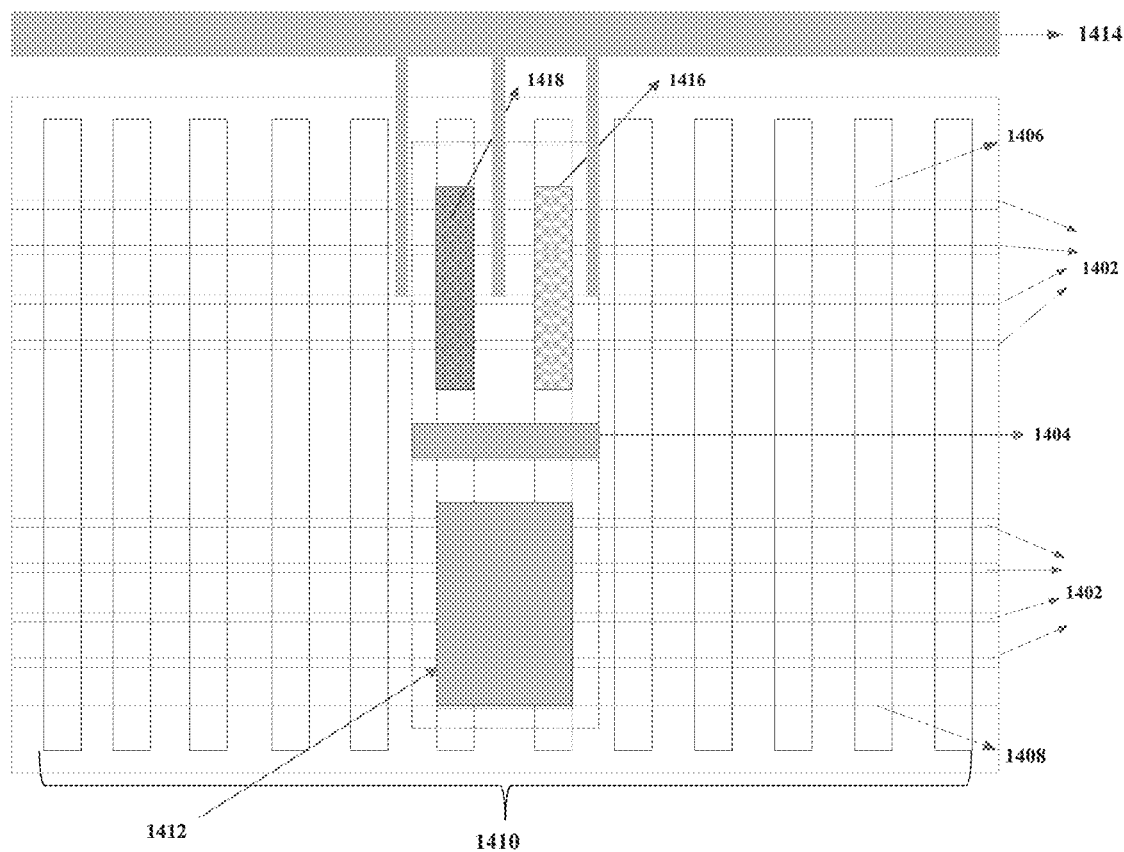
FIG. 14 is a schematic diagram illustrating an example method of fabricating a Fin Field Effect Transistor (FinFET) device, according to another embodiment.

FIG. 14 is a schematic diagram illustrating an example method of fabricating a Fin Field Effect Transistor (FinFET) device, according to another embodiment. In this embodiment, the position of the at least one floating gate and the SDB as shown in FIG. 13 is interchanged and the resultant design is shown in FIG. 14. As shown in FIG. 14, one or more fingers 1410 from the PFET side 1406 are removed. A half-DDB is introduced on the NFET side 1408 inside the cell boundary using the cut-poly layer 1404 to isolate the PFET 1406 and the NFET gates 1408. At least one PFET gate removed from at least two PFET gates cut from the NFET gate to a floating gate 1416 by connecting the drain and source terminal of the floating gate to a common power net. The other at least one PFET gate removed from the at least two PFET gates is converted in to an inactive gate using the SDB 1418 on the PFET gate 1406 cut from the NFET gate 1408. If, in a plan view, the NFET gates are below the PFET gates, the single diffusion break 1418 may be to the left of the floating gate 1416.

Figure 4:
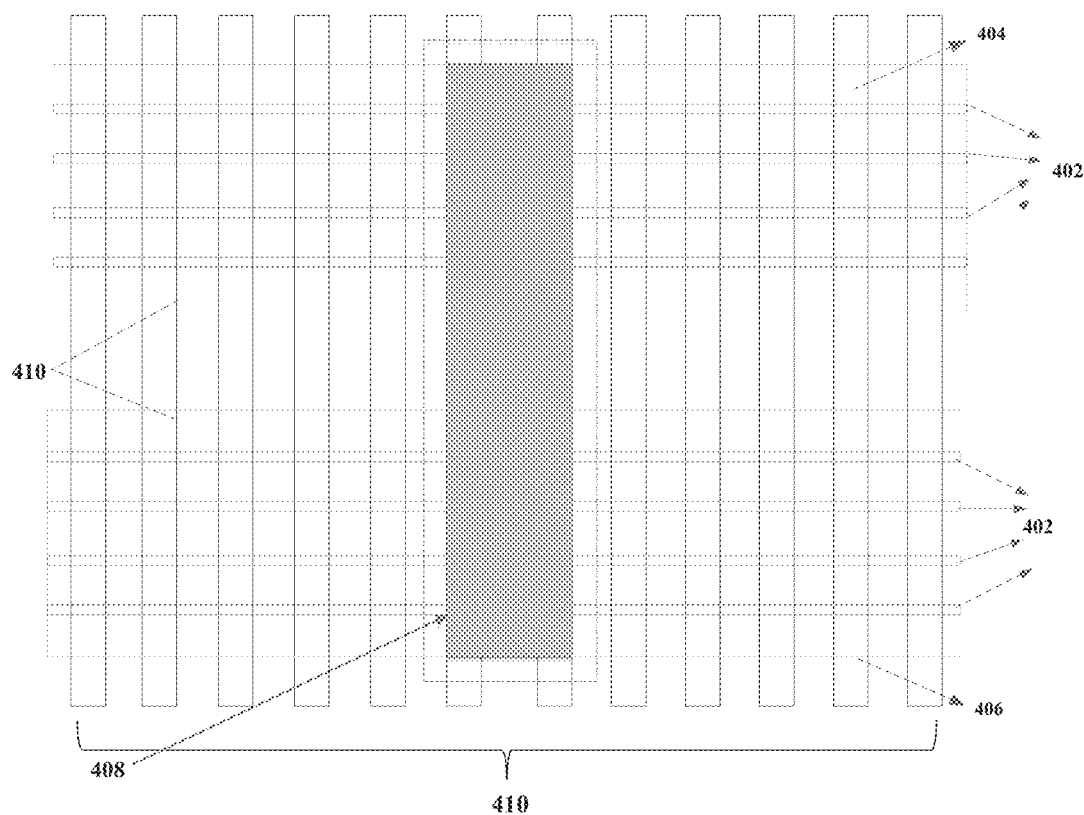
FIGS. 4 to 6 illustrate conventional cell layout of a FinFET based cell library having a single or double diffusion break, according to the existing art.
Figure 5:
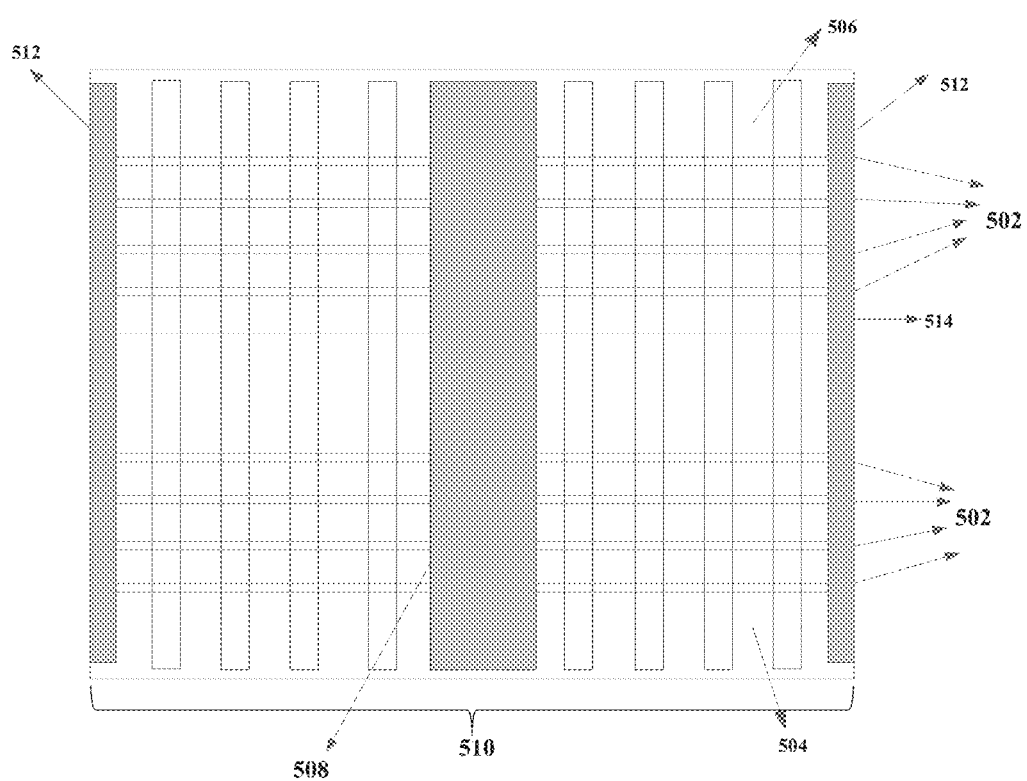
Figure 6:
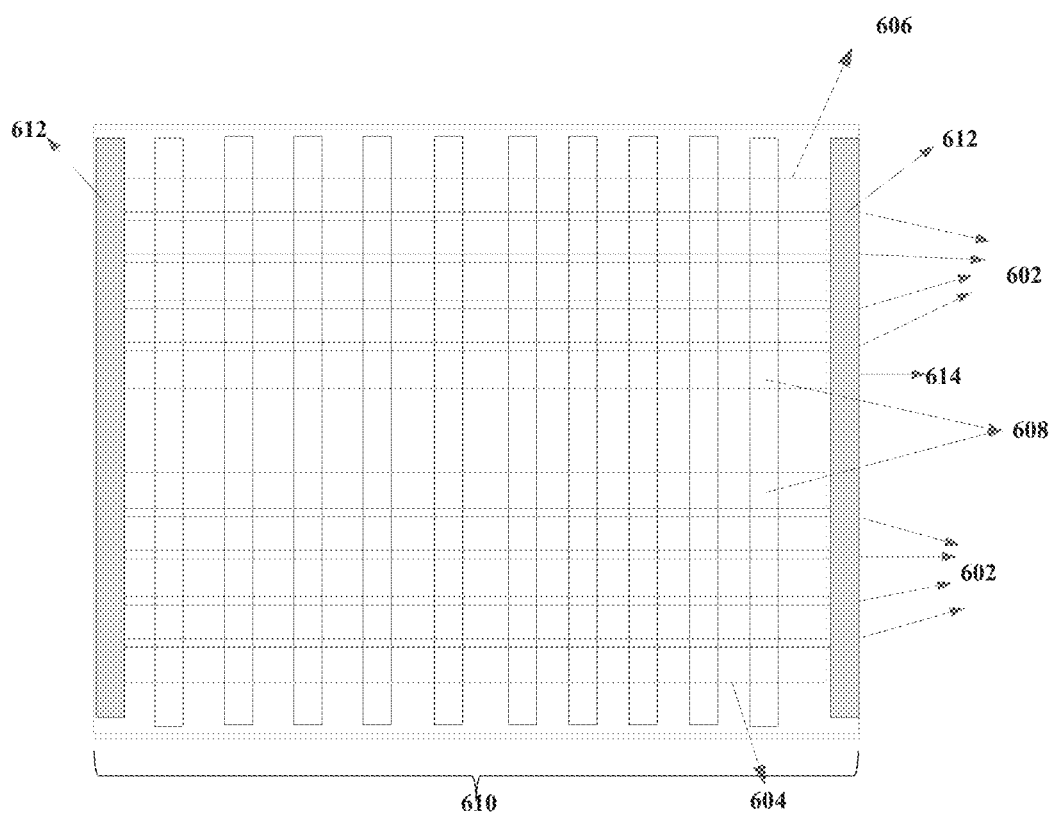
Figure 15:
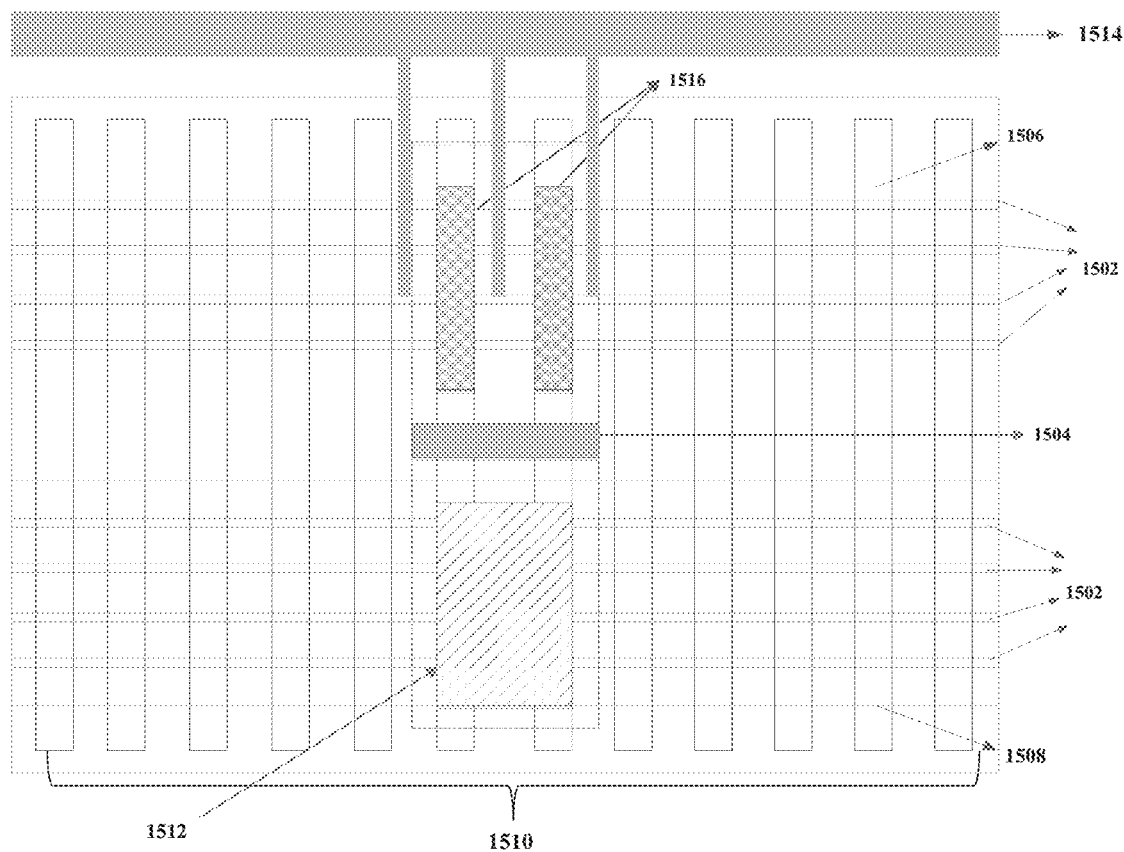
FIG. 15 is a schematic diagram illustrating an example method of fabricating a Fin Field Effect Transistor (FinFET) device, according to another embodiment.

FIG. 15 is a schematic diagram illustrating an example method of fabricating a Fin Field Effect Transistor (FinFET) device, according to another embodiment. In this fabrication method, an initial layout of FinFET device as shown in FIG. 4 is considered, which illustrates formation of double diffusion break (DDB) on both PFET and NFET side. The at least one DDB of a standard FinFET cell may be converted to a half-DDB 1512 on the NFET side 1508 inside the FinFET cell boundary using a cut-poly layer 1504 to isolate the PFET gates 1506 and NFET gates 1508. After converting the one DDB to half-DDB on the NFET side, the PFET gates are converted into two floating gates 1516 by connecting the drain terminal and source terminal of the PFET gates to the common power net 1514. The common power net 1514 may include metal.

Figure 16:
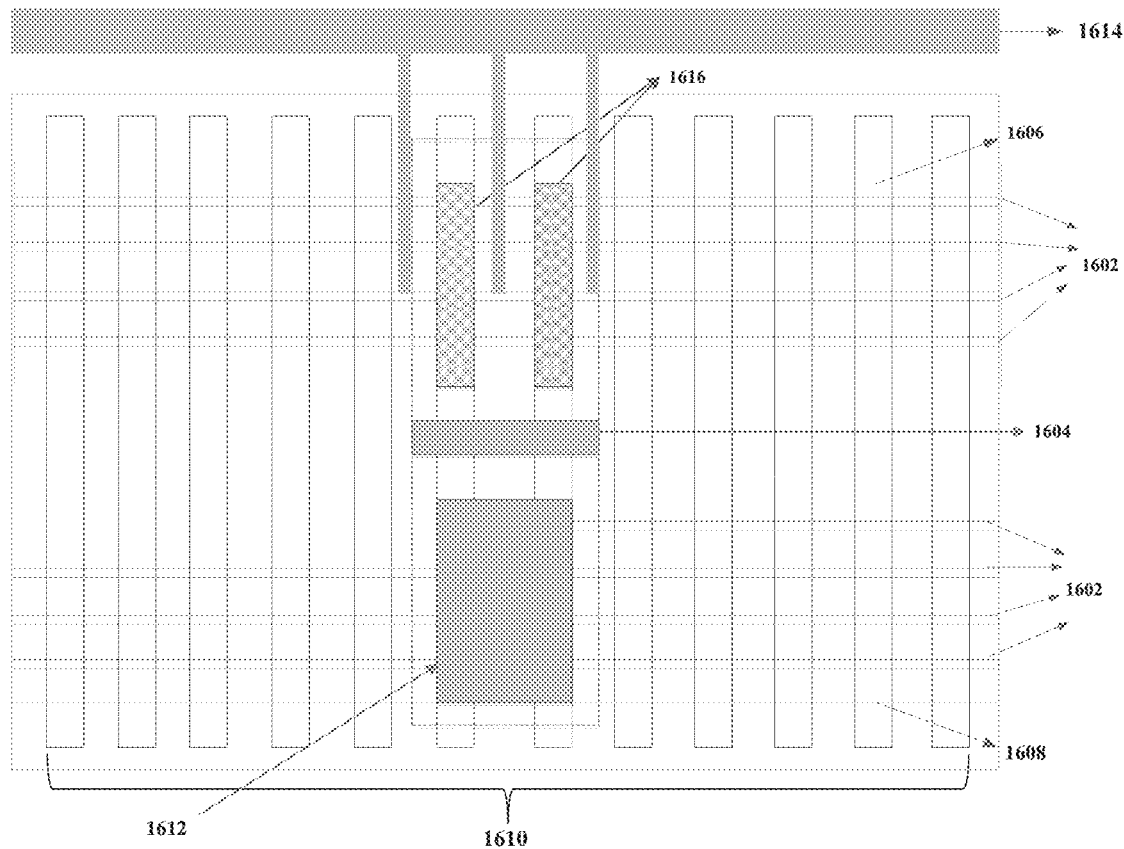
FIG. 16 is a schematic diagram illustrating an example method of fabricating a Fin Field Effect Transistor (FinFET) device, according to another embodiment.

FIG. 16 is a schematic diagram illustrating an example method of fabricating a Fin Field Effect Transistor (FinFET) device, according to another embodiment. According to this embodiment, the standard FinFET cell layout as shown in FIG. 4 is considered. At first, a hybrid DDB structure as shown in FIG. 7 may be introduced on the standard FinFET cell layout. The hybrid DDB structure comprising a double diffusion break (DDB) 1612 formed on the NFET side and floating gates 1616 formed on the PFET side and a cut-poly layer 1604 isolating the PFET 1606 and NFET gates 1608 are shown in dotted lines in FIG. 16. One or more fins 1602 belonging to one or more input signal on the NFET side 1608 may be removed to obtain the final FinFET layout as shown in FIG. 16.

Figure 17:
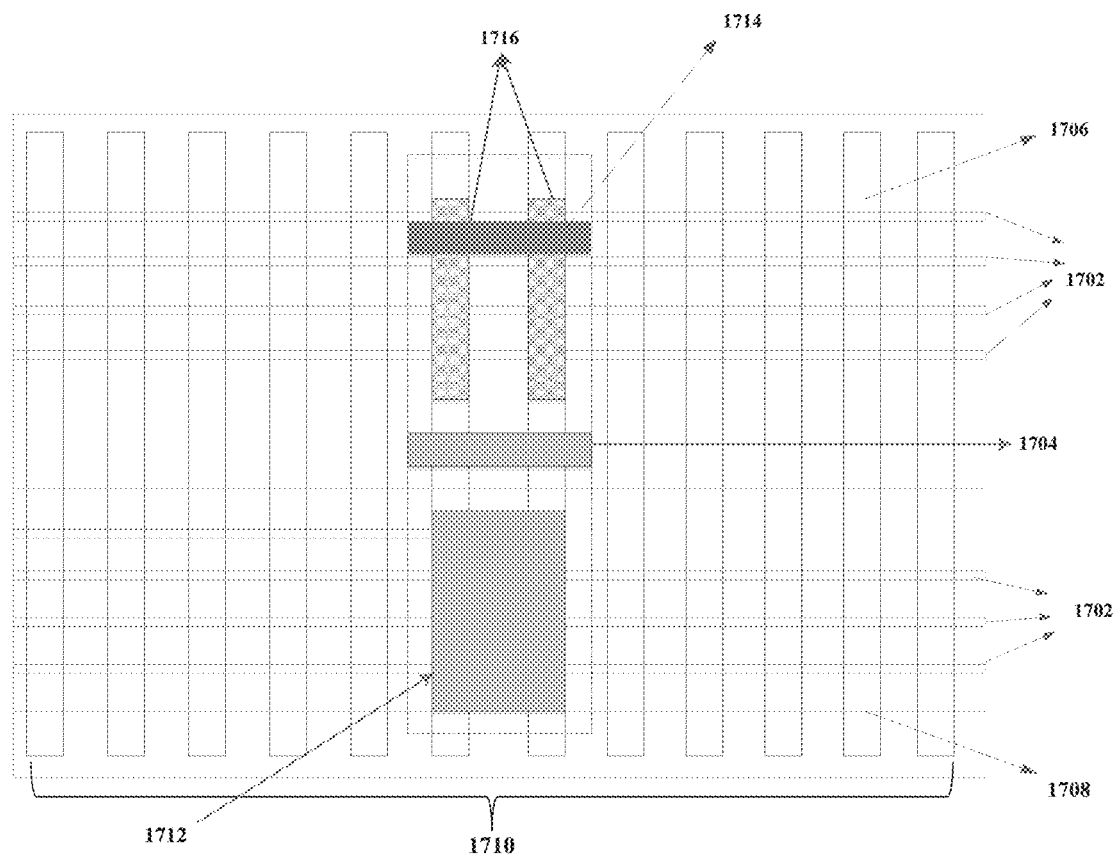
FIG. 17 is a schematic diagram illustrating an example method of fabricating a Fin Field Effect Transistor (FinFET) device, according to another embodiment.

FIG. 17 is a schematic diagram illustrating an example method of fabricating a Fin Field Effect Transistor (FinFET) device, according to another embodiment. According to this embodiment, the standard FinFET cell layout as shown in FIG. 4 is considered. Also, in this embodiment, the fabrication process remains the same as shown in FIG. 16 except the removal of one or more fins belonging to the one or more input signals. As shown in FIG. 17, the one or more NFET fins 1702 belonging to the input signals being directly connected to an outside signal reducing input capacitance offered by the FinFET gate and cell leakage. Further, as shown in FIG. 17, the one or more floating gates 1714 and 1716 formed on the PFET side 1706 by shorting source terminal and drain terminal of the PFET gate 1706 to a common internal net.

Figure 18:
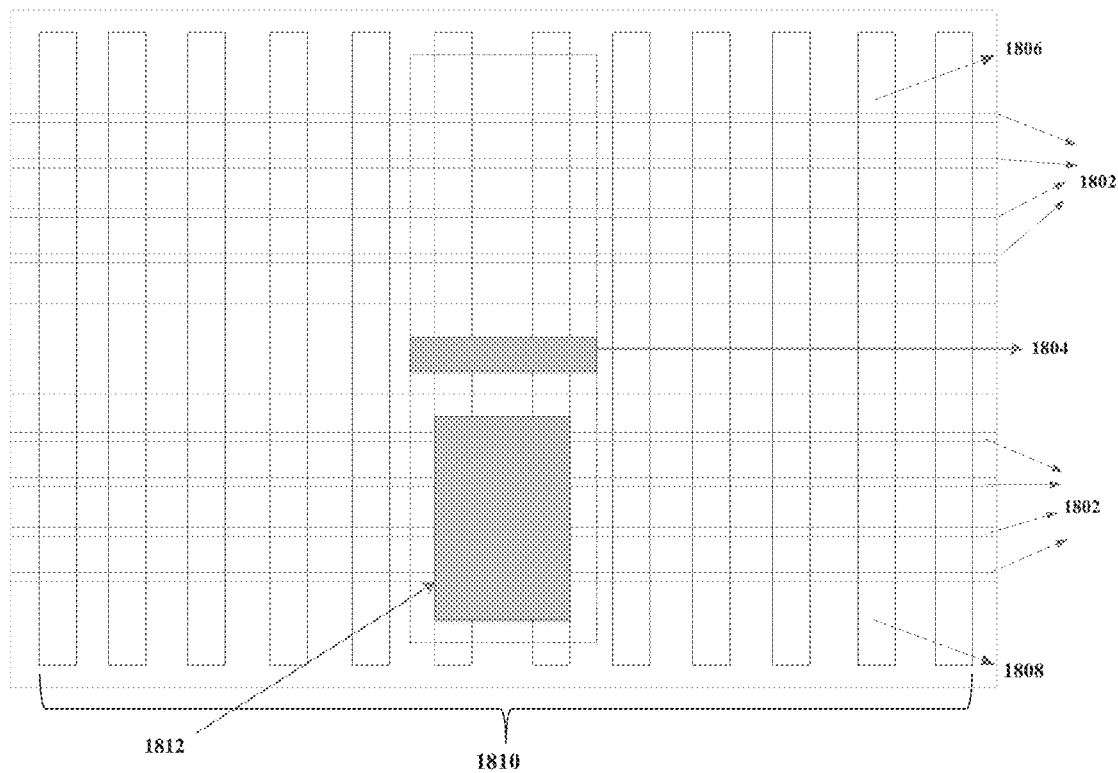
FIG. 18 is a schematic diagram illustrating an example method of fabricating a Fin Field Effect Transistor (FinFET) device, according to another embodiment.

FIG. 18 is a schematic diagram illustrating an example method of fabricating a Fin Field Effect Transistor (FinFET) device, according to another embodiment. According to this embodiment, the standard FinFET cell layout with the formation of double diffusion break as shown in FIG. 4 is considered for fabrication. Then, the existing at least one DDB as shown in FIG. 4 is converted to a half-DDB 1812 on the NFET side 1808 inside the FinFET cell using a cut-poly layer 1804 to isolate the PFET gates 1806 and the NFET gates 1808. The DDB formed on the PFET side 1806 may be removed and a space is created. Then, one or more fingers 1810 are added in the space created after the removal of DDB on the PFET side 1806 as shown in FIG. 18.

Figure 19:
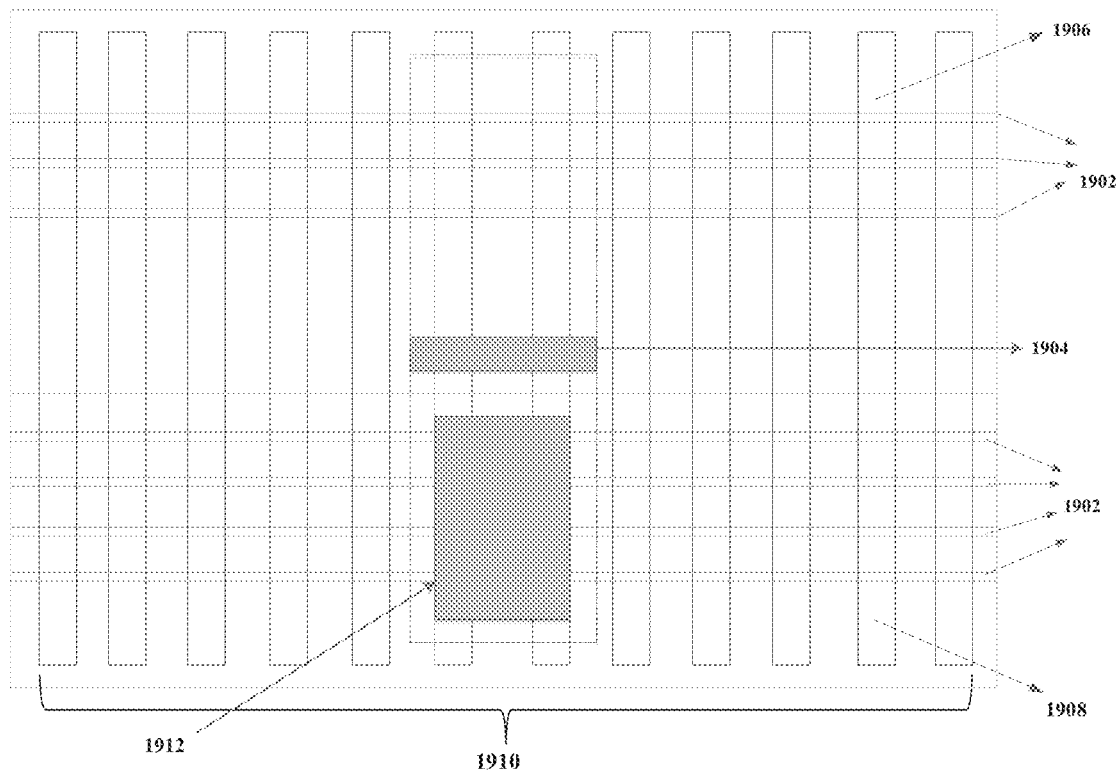
FIG. 19 is a schematic diagram illustrating an example method of fabricating a Fin Field Effect Transistor (FinFET) device, according to another embodiment.

FIG. 19 is a schematic diagram illustrating an example method of fabricating a Fin Field Effect Transistor (FinFET) device, according to another embodiment. According to this embodiment, the fabrication process as mentioned in FIG. 18 is repeated with an additional step of removing of one or more fins on the PFET side. In order to create this design, the standard FinFET cell layout as shown in FIG. 4 is considered. Then, the existing at least one DDB as shown in FIG. 4 is converted to a half-DDB 1912 on the NFET side 1908 inside the FinFET cell using a cut-poly layer 1904 to isolate the PFET gates 1906 and the NFET gates 1908. The DDB formed on the PFET side 1906 may be removed to create a space thereon. Then, one or more fingers 1910 are added in the space created after the removal of DDB on the PFET side 1906 and one or more fins 1902 on the PFET side 1906 is removed to obtain the design as shown in FIG. 19.

Figure 20:
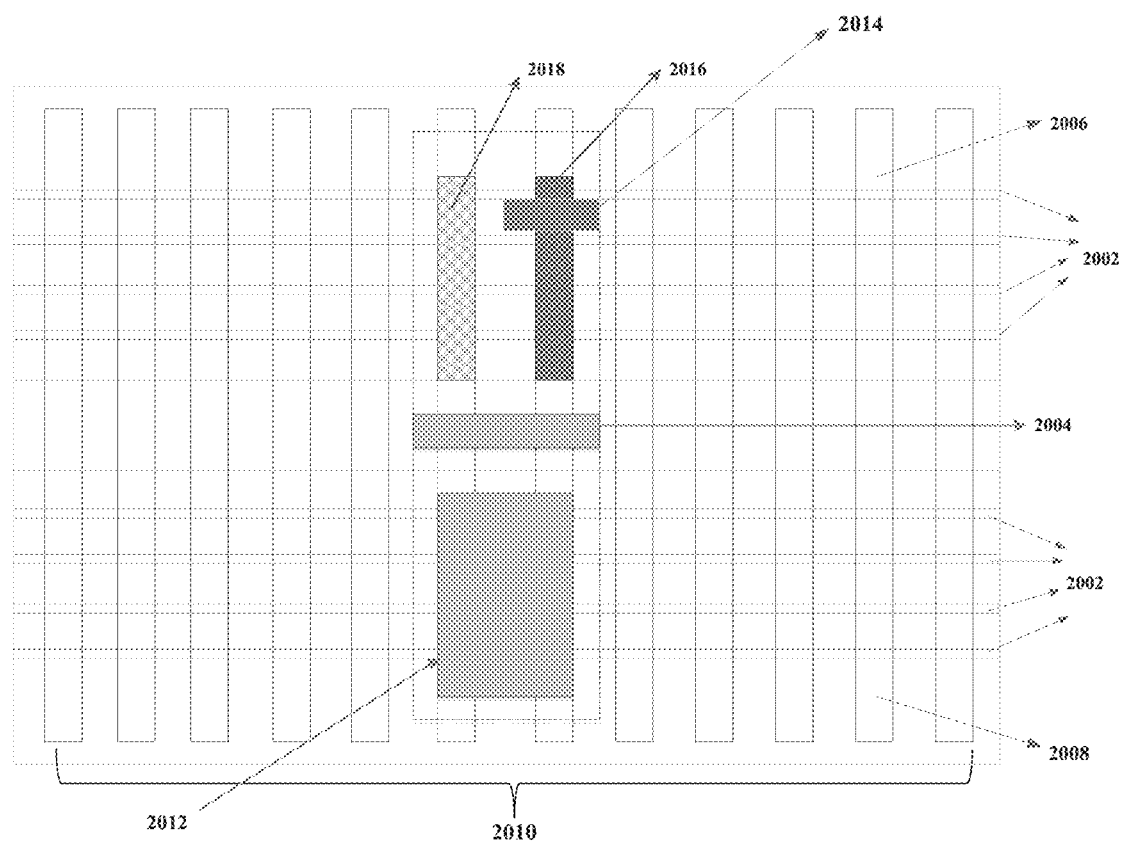
FIG. 20 is a schematic diagram illustrating an example method of fabricating a Fin Field Effect Transistor (FinFET) device, according to another embodiment.

FIG. 20 is a schematic diagram illustrating an example method of fabricating a Fin Field Effect Transistor (FinFET) device, according to another embodiment. According to this embodiment, the standard FinFET cell layout with the formation of double diffusion break as shown in FIG. 4 is considered for fabrication. As shown in FIG. 4, at least one double diffusion break may be converted to a half-DDB 2012 on the NFET side 2008 inside the FinFET cell boundary using a cut-poly layer 2004 to isolate the PFET gates 2006 and the NFET gates 2008. The other double diffusion break formed on the PFET side 2006 may be removed to create an empty space. On the empty space, at least two new PFET gates are created. Of the two new PFET gates 2006, one PFET gate 2006 may be converted into a single diffusion break (SDB) 2016 and the other PFET fate 2006 is converted into a floating gate 2016 by connecting drain and source terminals to a common internal net 2018. The resultant fabricated FinFET structure is shown in FIG. 20. The floating gates may be formed by shorting the drain terminal and source terminal of the PFET gates to the common power net.

Figure 21:
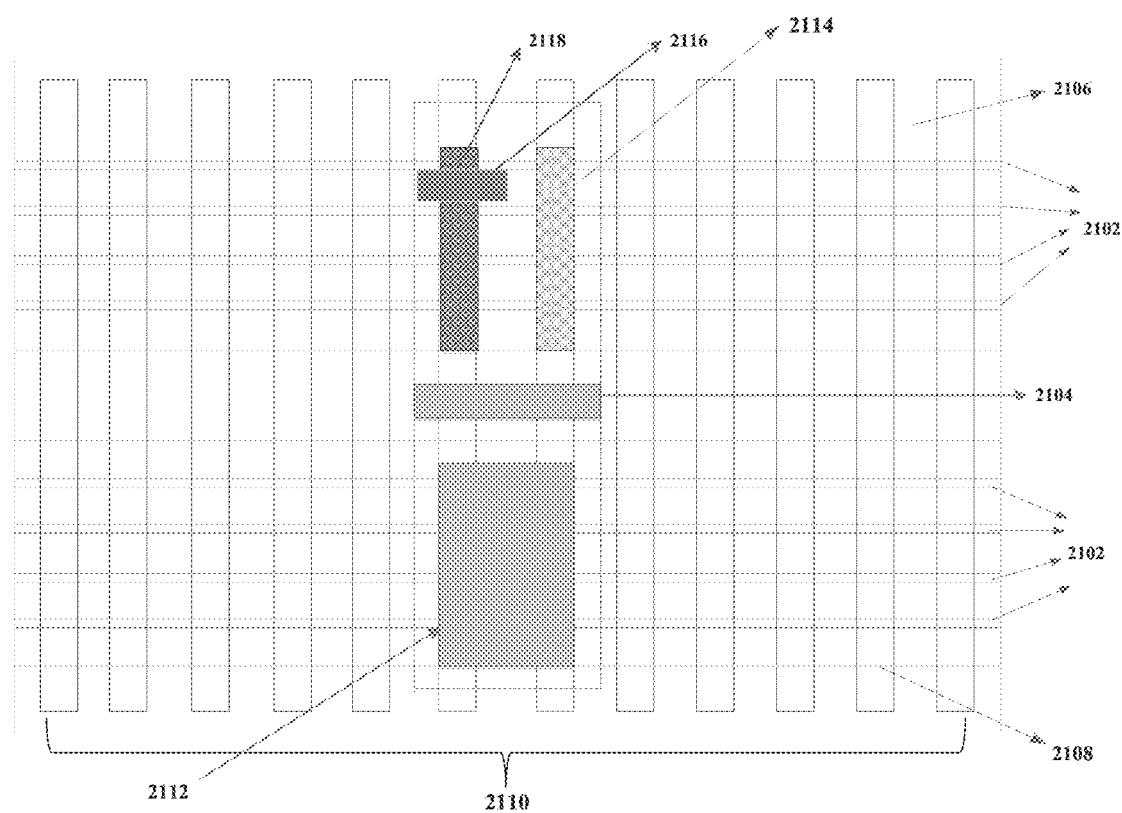
FIG. 21 is a schematic diagram illustrating an example method of fabricating a Fin Field Effect Transistor (FinFET) device, according to another embodiment.

In some embodiments, the position of the PFET floating gate and the SBD may be interchanged as shown in FIG. 21. As shown in FIG. 21, at least two PFET gates 2116 and 2114 are created in a space created due to the removal of one or more fingers on the PFET side 2106. The at least two PFET gates are positioned in such a way that it is juxtapose to the position of gates shown in FIG. 20.

Figure 22:
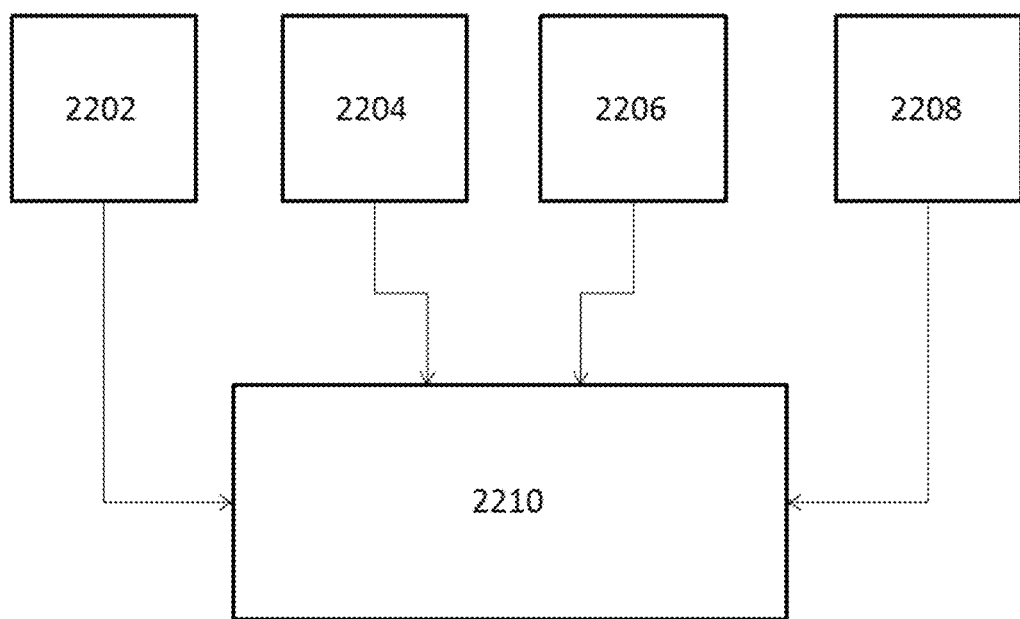
FIG. 22 is a block diagram illustrating an example method of fabricating a semiconductor device, according to another embodiment.

The descriptions above may relate to the design of reticles used as photomasks for the manufacturing of a semiconductor device 2210, as shown in FIG. 22. For example, inventive concepts may describe the design of a fin reticle 2202, the design of a finger reticle 2204, the design of a cut-poly reticle 2206, and the design of a metal reticle 2208. The reticles may be used as photomasks in the manufacturing of semiconductor devices, such as the semiconductor device 2210.

Although the embodiments herein are described with various specific embodiments, it will be obvious for a person skilled in the art to practice inventive concepts with modifications. However, all such modifications are deemed to be within the scope of the claims. It is also to be understood that the following claims are intended to cover all of the generic and specific features of the embodiments described herein and all the statements of the scope of the embodiments which as a matter of language might be said to fall there between.

The invention claimed is:

1. A field effect transistor structure comprising:
   a first FET side and a second FET side region extending in a first direction and spaced apart from each other in a second direction, the second direction crossing the first direction;
   a first finger and a second finger on the first FET side, the first finger and the second finger extending in the second direction and spaced apart from each other in the first direction;
   a first source/drain terminal at a side of the first finger;
   a second source/drain terminal between the first finger and the second finger; a third source/drain terminal at a side of the second finger;
   a common power net extending in the first direction and connected to the first to third source/drain terminals; and
   a half double diffusion break (Half-DDB) on the second FET side, the Half-DDB isolating the first and second fingers in the second FET side,
   wherein the first FET side continuously extends in the first direction.

2. The structure of claim 1, wherein the first FET side includes a plurality of first fins that are extending in the first direction and are spaced apart from each other in the second direction, and
   wherein the second FET side includes a plurality of second fins that are extending in the first direction and are spaced apart from each other in the second direction.

3. The structure of claim 2, wherein the first FET side includes N number of the first fins, and the second FET side includes M number of the second fins,
   wherein N is different from M, and
   wherein N and M are integers.

4. The structure of claim 3, wherein N is greater than M.

5. The structure of claim 1, wherein the field effect transistor structure is a standard FinFet cell.

6. The structure of claim 1, further comprising: a cut-poly layer between the first FET side and the second FET side, wherein the cut-poly layer extends in the first direction and is between the half double diffusion break (Half-DDB) and each of the first and second fingers.

7. The structure of claim 1, wherein the first FET side is a P-type FinFet side, and the second FET side is an N-type FinFet side.

8. A field effect transistor structure comprising:
   a first FET side and a second FET side extending in a first direction and spaced apart from each other in a second direction, the second direction crossing the first direction
   a first finger and a second finger on the first FET side, the first finger and the second finger extending in the second direction and spaced apart from each other in the first direction;
   a first source/drain terminal at a side of the first finger;
   a second source/drain terminal between the first finger and the second finger; a third source/drain terminal at a side of the second finger;
   a common internal net on the first FET side, the common internal net connected to the first to third source/drain terminals; and
   a half double diffusion break (Half-DDB) on the second FET side, the Half-DDB isolating the first and second fingers in the second FET side.

9. The structure of claim 8, wherein the common internal net overlaps with the first and second fingers.

10. The structure of claim 8, wherein the first FET side includes a plurality of first fins that are extending in the first direction and are spaced apart from each other in the second direction, and
    wherein the second FET side includes a plurality of second fins that are extending in the first direction and are spaced apart from each other in the second direction.

11. The structure of claim 10, wherein the first FET side includes N number of the first fins, and the second FET side includes M number of the second fins,
    wherein N is different from M, and
    wherein N and M are integers.

12. The structure of claim 11, wherein N is greater than M.

13. The structure of claim 8, wherein the field effect transistor structure is a standard FinFet cell.

14. The structure of claim 13, wherein the first FET side is a P-type FinFet side, and the second FET side is an N-type FinFet side.

15. The structure of claim 8, further comprising: a cut-poly layer between the first FET side and the second FET side, wherein the cut-poly layer extends in the first direction.

16. The structure of claim 15, wherein the cut-poly layer extends between the half double diffusion break (Half-DDB) and each of the first and second fingers.

* * * * *